United States Patent
Lee et al.

(10) Patent No.: US 7,491,606 B2
(45) Date of Patent: Feb. 17, 2009

(54) SEMICONDUCTOR DEVICE AND METHOD FOR FABRICATING THE SAME

(75) Inventors: Sung-Kwon Lee, Kyoungki-do (KR); Myung-Ok Kim, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 278 days.

(21) Appl. No.: 11/360,142

(22) Filed: Feb. 22, 2006

(65) Prior Publication Data

US 2006/0284228 A1   Dec. 21, 2006

(30) Foreign Application Priority Data

Jun. 15, 2005   (KR) .................. 10-2005-0051344

(51) Int. Cl.
*H01L 21/8242* (2006.01)

(52) U.S. Cl. .............. 438/254; 438/217; 438/238; 438/239; 438/240; 438/241; 438/253; 438/256; 257/E21.011

(58) Field of Classification Search ................ 438/256, 438/397

See application file for complete search history.

(56) References Cited

U.S. PATENT DOCUMENTS 6,365,453 B1* 4/2002 Deboer et al. ............... 438/253
2004/0266100 A1* 12/2004 Cho et al. .................... 438/253

FOREIGN PATENT DOCUMENTS

KR      2003-0091450       12/2003

* cited by examiner

*Primary Examiner*—N Drew Richards
*Assistant Examiner*—Kyoung Lee
(74) *Attorney, Agent, or Firm*—Blakely, Sokoloff, Taylor & Zafman

(57) ABSTRACT

A method for fabricating a three dimensional type capacitor is provided. The method includes forming a first insulation layer including first contact layers over a substrate, forming a second insulation layer over the first insulation layer, forming second contact layers by using a material having an etch selectivity different from the first contact layers such that the second contact layers are connected with the first contact layers within the second insulation layer, forming an etch stop layer over the second insulation layer and the second contact layers, forming a third insulation layer over the etch stop layer, etching the third insulation layer and the etch stop layer to form first contact holes exposing the second contact layers, etching the exposed second contact layers to form second contact holes exposing the first contact holes, and forming bottom electrodes over the inner surface of the second contact holes.

13 Claims, 17 Drawing Sheets

SEMICONDUCTOR DEVICE AND METHOD FOR FABRICATING THE SAME

FIELD OF THE INVENTION

The present invention relates to a method for fabricating a semiconductor device; and more particularly, to a method for fabricating a three dimensional type capacitor to secure a high capacitance by increasing an effective surface area of the capacitor.

DESCRIPTION OF RELATED ARTS

As semiconductor devices have become highly integrated, there has been a great effort to secure a higher capacitance in a same layout area. Since a capacitance of a capacitor is proportionate to a permittivity (□) and an effective surface area of an electrode, but the capacitance of the capacitor is inversely proportionate to a distance between electrodes, up to now, it has been tried to secure a surface area of an electrode for storing electric charges or minimize a distance between electrodes by making a dielectric substance with a thin film.

However, making the dielectric substance with the thin film provides a limitation which a leakage current increases and accordingly, a capacitor structure has been formed in a three dimensional type such as a planar stack type, a concave type, or a cylinder type, thereby increasing an effective surface area of the capacitor. Meanwhile, along with applying the three dimensional type capacitor, a ferroelectric substance made of a thin film and having a high permittivity has been used.

FIGS. 1A to 1F are cross-sectional views illustrating a conventional method for fabricating a three dimensional capacitor.

First, as shown in FIG. 1A, a first insulation layer 10 in which a plurality of first contact layers 11 are interposed in the first insulation layer 10 is formed over a substrate (not shown) provided with a predetermined semiconductor structure (not shown).

Next, a second insulation layer 12 is deposited over the first insulation layer 10 including the first contact layers 11. Afterwards, a plurality of bit lines 13 are formed over the second insulation layer 12. At this time, a plurality of capping layers 14 are formed over the bit lines 13 to protect the bit lines 13, and a plurality of spacers 15 are formed on sidewalls of the bit lines 13.

Next, a third insulation layer 16 is deposited over the above resulting structure and then, the third insulation layer 16, and the second insulation layer 12 are etched, thereby forming a plurality of first contact holes (not shown) exposing the first contact layers 11.

Next, a plurality of second contact layers 17 burying the first contact holes are formed.

Next, as shown in FIG. 1B, an etch stop layer 18 is deposited over the third insulation layer 16 including the second contact layers 17.

Next, as shown in FIG. 1C, a fourth insulation layer 19 is formed over the etch stop layer 18 and afterwards, a hard mask 20 is deposited over the fourth insulation layer 19.

Next, as shown in FIG. 1D, a predetermined photoresist pattern 21 is formed over the hard mask 20. Then, an etching process 22 is performed by using the photoresist pattern 21 as an etch mask, thereby etching the hard mask 20 and the fourth insulation layer 19. At this time, the etching process 22 is stopped over a certain portion of the etch stop layer 18 once and thus, a plurality of second contact holes 23 exposing the certain portions of the etch stop layer 18 can be formed.

Next, as shown in FIG. 1E, a stripping process is performed, thereby removing the photoresist pattern 21 (refer to FIG. 1D) and a plasma etching process is performed, thereby removing the hard mask 20 (refer to FIG. 1D).

Next, the etch stop layer 18 exposed beneath bottom portions of the second contact holes 23 (refer to FIG. 1D) is etched, thereby forming a plurality of third contact holes 24 exposing the second contact layers 17.

Next, as shown in FIG. 1F, a bottom electrode 25 is formed over an inner surface of each of the third contact holes 24 (refer to FIG. 1E), and a dielectric layer 26 is formed over a height difference of the above resulting structure. Afterwards, a top electrode 27 is formed on the dielectric layer 26 to fill the third contact holes 24.

FIG. 2 is a microscopic image of scanning electron microscopy (SEM) illustrating the capacitor of the semiconductor device formed through steps shown in FIGS. 1A to 1F.

However, there is a limitation in increasing an effective surface area if the three dimensional type capacitor is formed through the above described steps. Accordingly, it may be difficult to secure a capacitance required by the highly integrated semiconductor device.

SUMMARY OF THE INVENTION

It is, therefore, an object of the present invention to provide a method for fabricating a semiconductor device capable of securing a capacitance required by a highly integrated semiconductor device by increasing an effective surface area of a capacitor.

In accordance with one aspect of the present invention, there is provided a method for fabricating a semiconductor device, including: forming a first insulation layer including a plurality of first contact layers over a substrate; forming a second insulation layer over the first insulation layer; forming a plurality of second contact layers by using a material having an etch selectivity different from the first contact layers such that the second contact layers are connected with the first contact layers within the second insulation layer; forming an etch stop layer over the second insulation layer and the second contact layers; forming a third insulation layer over the etch stop layer; etching the third insulation layer and the etch stop layer to form a plurality of first contact holes exposing the second contact layers; etching the exposed second contact layers to form a plurality of second contact holes exposing the first contact holes; and forming bottom electrodes over the inner surface of the second contact holes.

In accordance with another aspect of the present invention, there is provided a method for fabricating a semiconductor device, including: forming a first stack structure over a substrate including a plurality of first contact layers; forming a plurality of first openings inside the first stack structure such that the first openings expose the first contact layers; forming a plurality of second contact layers in the first openings; forming a second stack structure over the second contact layers and the first stacked structure; etching the second stack structure using a pattern as a mask to expose the second contact layers; etching the exposed second contact layers to form second openings exposing the first contact layers; and forming bottom electrodes over the inner surface of the second openings.

In accordance with further aspect of the present invention, there is provided a semiconductor device, including: a first stack structure over a substrate including a plurality of first contact layers; a plurality of first openings in the stack structure such that the first openings expose the first contact layers; second contact layers formed in the first openings; a second stack structure over the second contact layers and the first stack structure; a plurality of second openings by etching the second stack structure and the second contact layers using a pattern as a mask; and a plurality of bottom electrodes over the inner surface of the second openings.

BRIEF DESCRIPTION OF THE DRAWINGS

The above and other objects and features of the present invention will become better understood with respect to the following description of the preferred embodiments given in conjunction with the accompanying drawings, in which.

DETAILED DESCRIPTION OF THE INVENTION

Figure 1A:
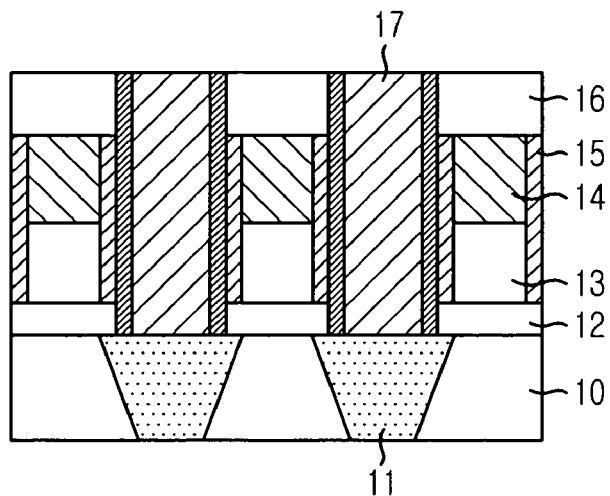
FIGS. 1A to 1F are cross-sectional views illustrating a conventional method for fabricating a three dimensional type capacitor.
Figure 1B:
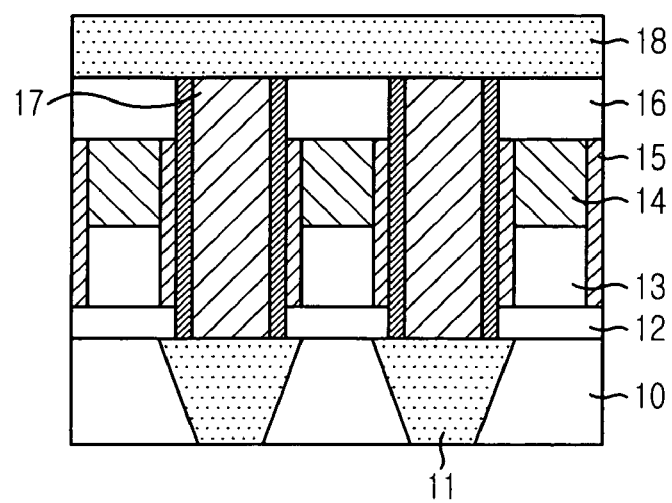
Figure 1C:
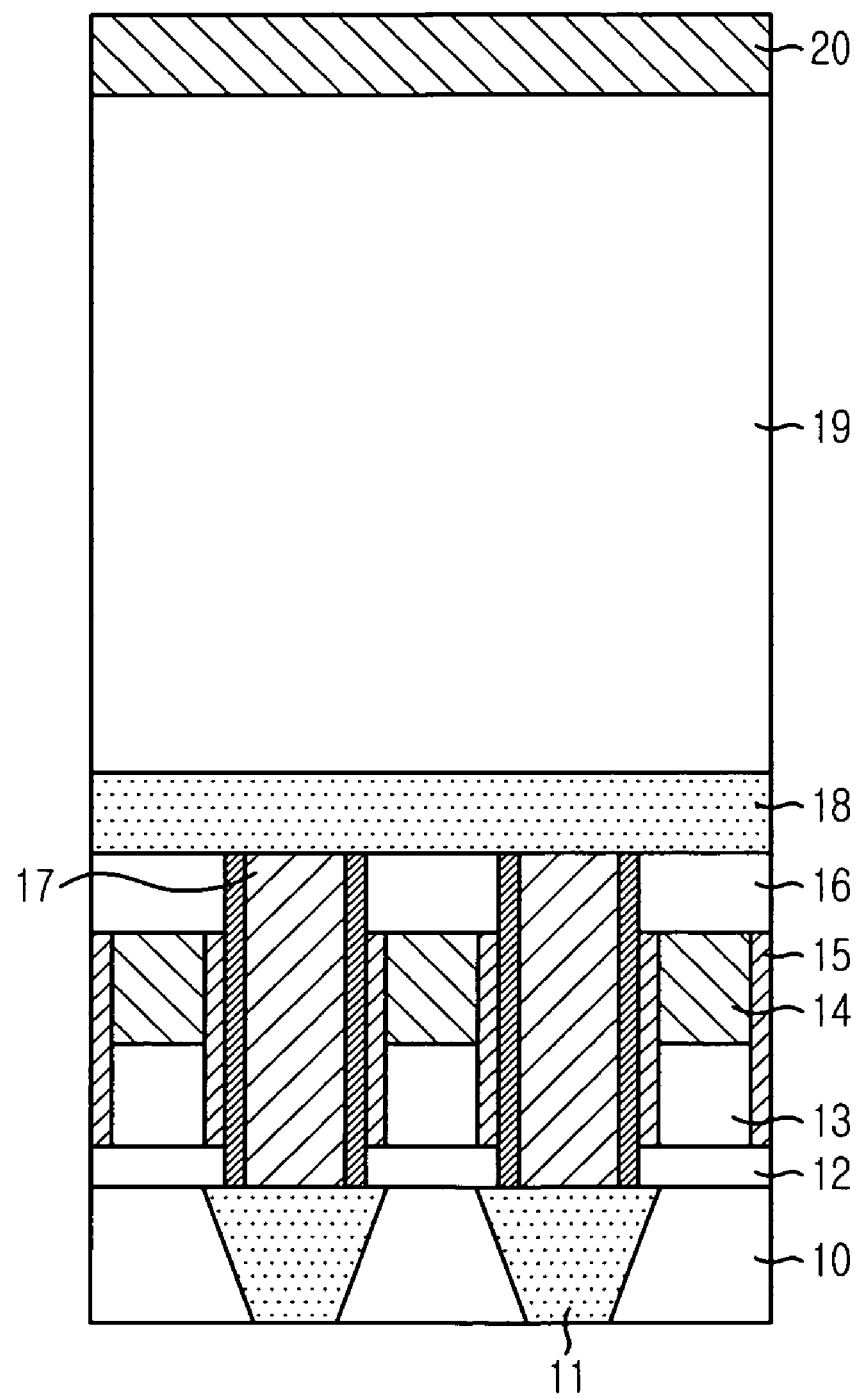
Figure 1D:
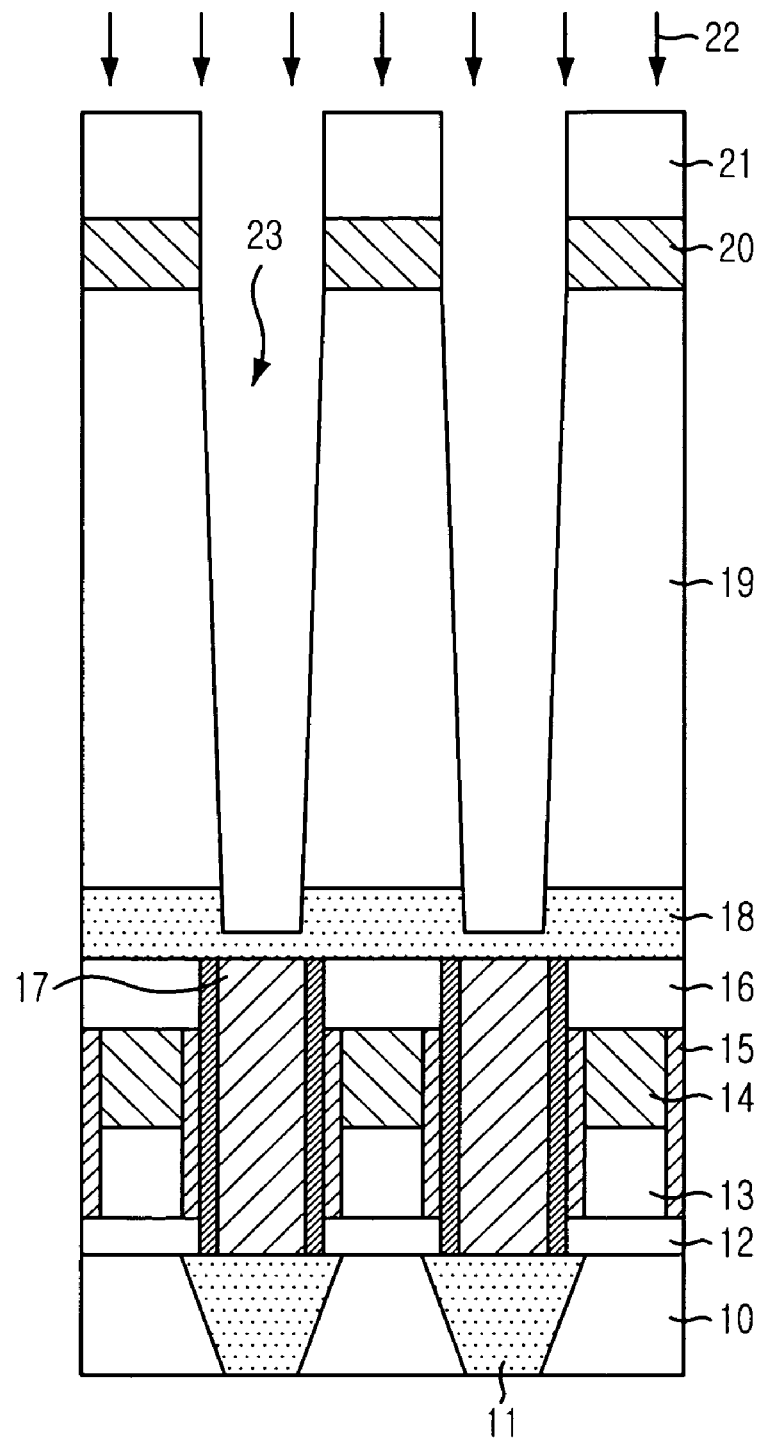
Figure 1E:
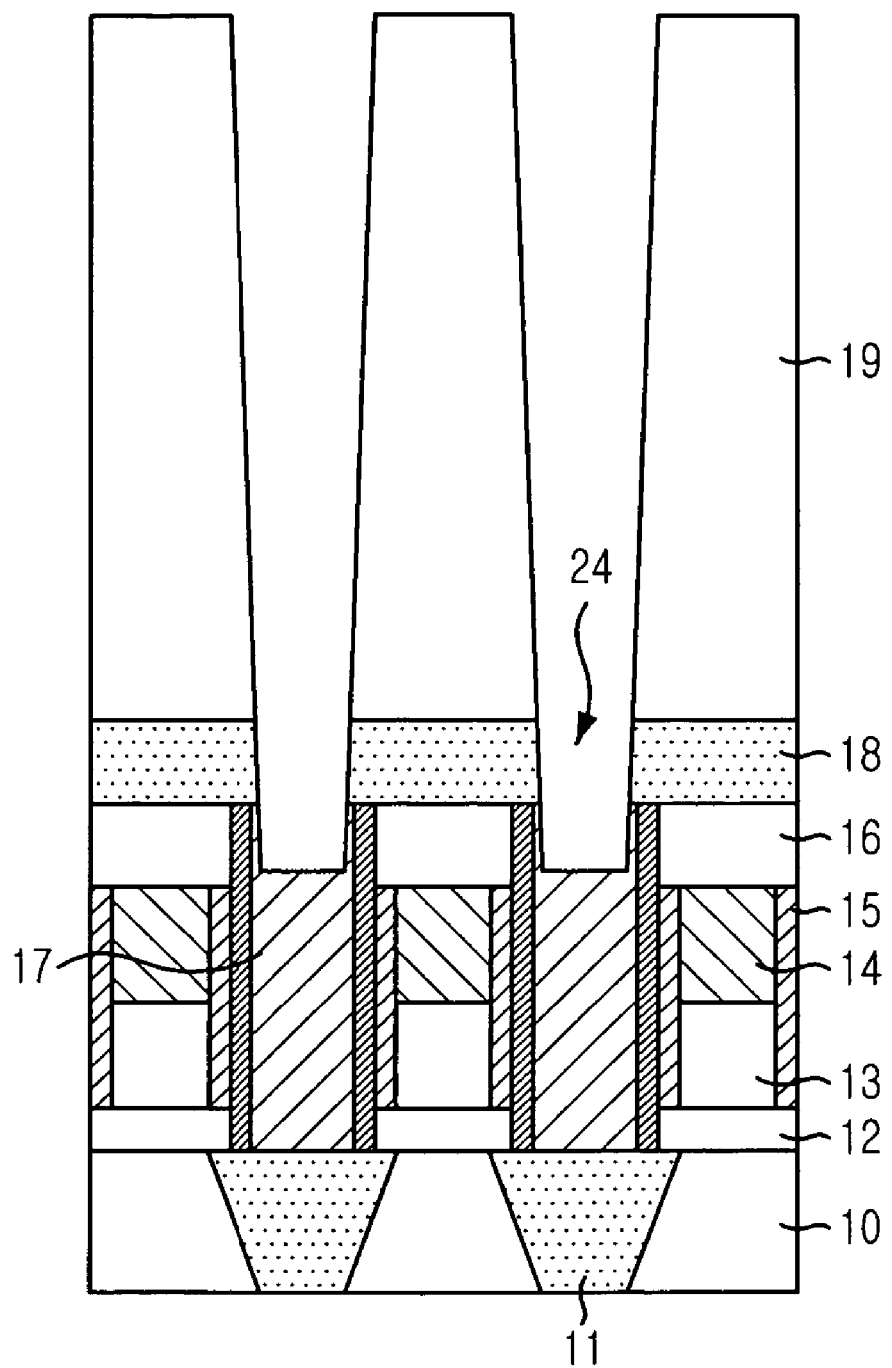
Figure 1F:
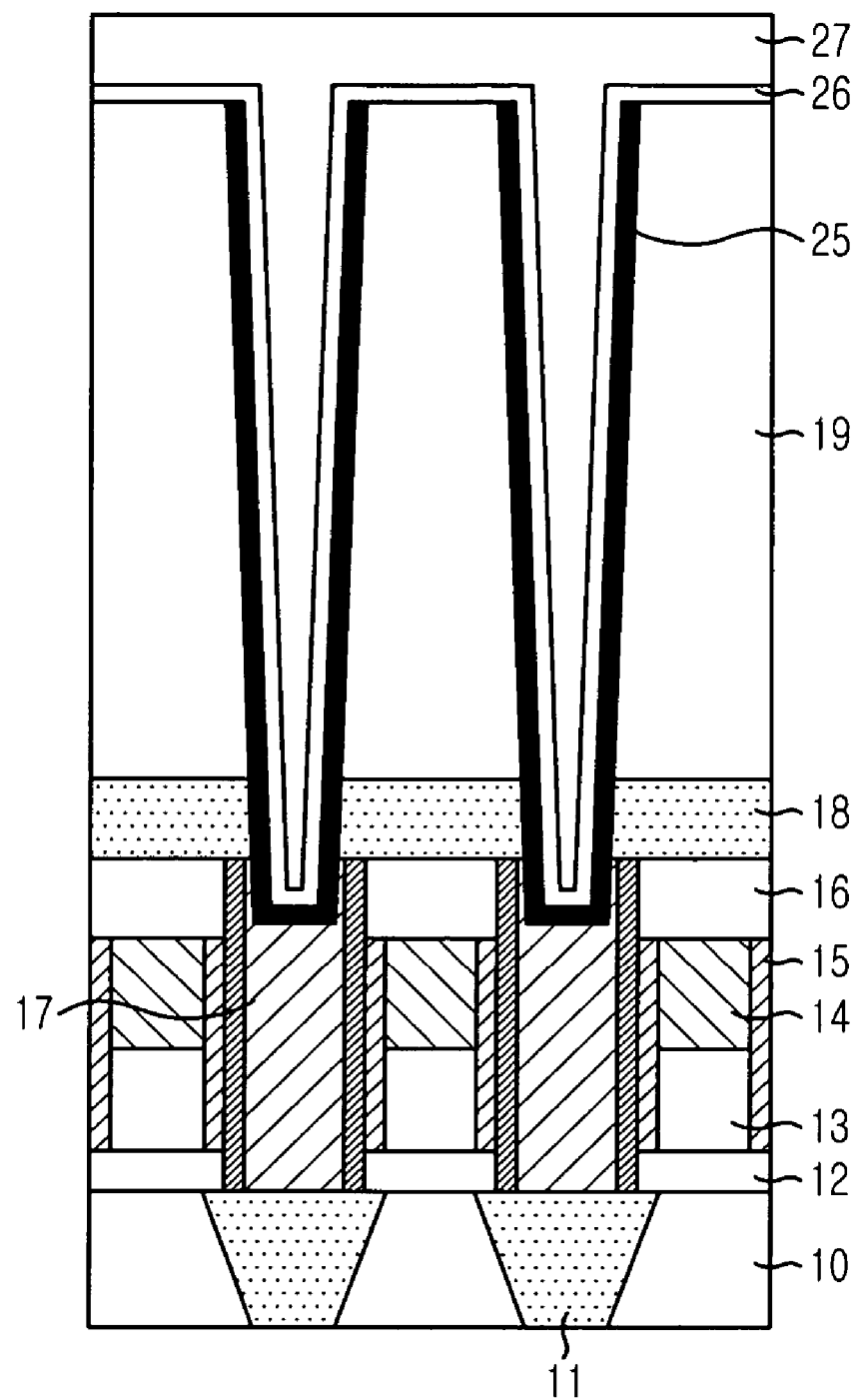
Figure 2:
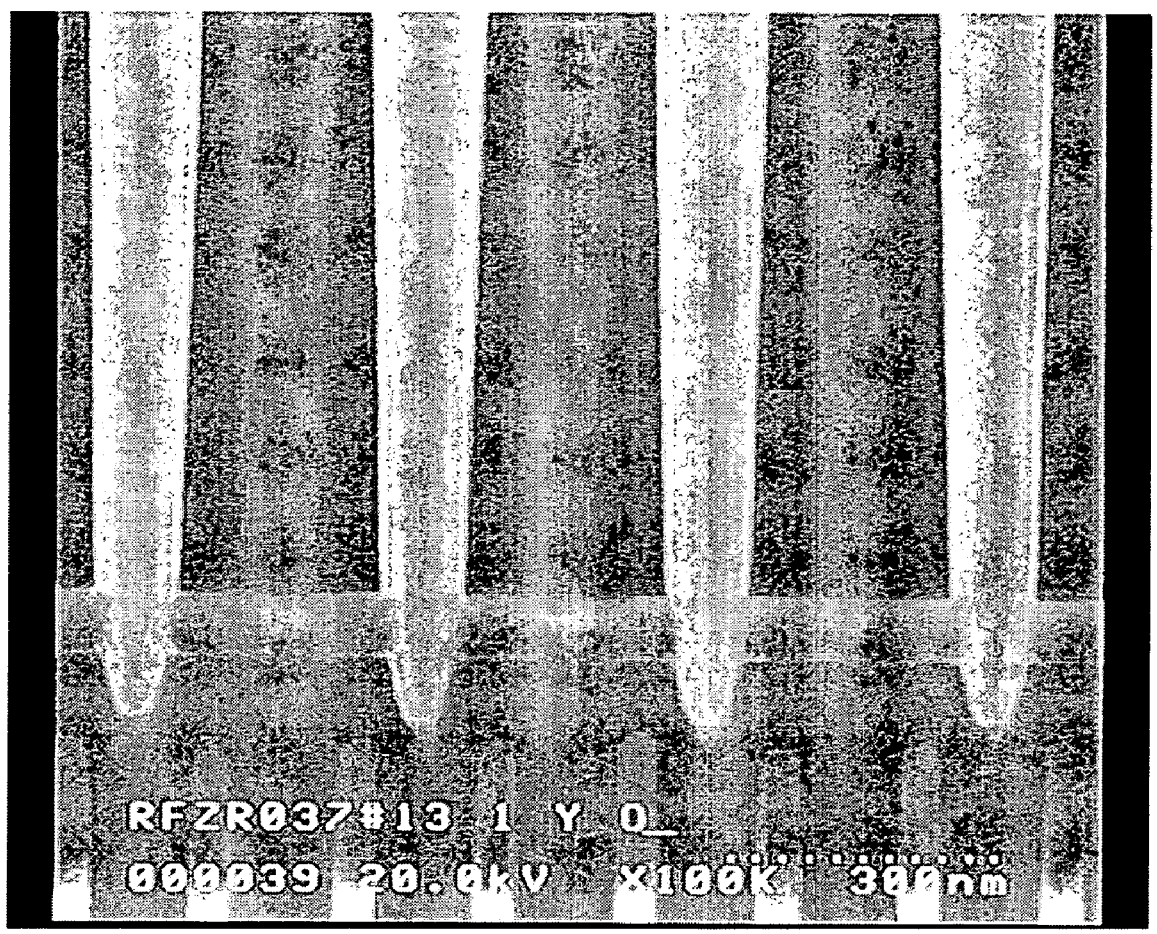
FIG. 2 is a micrographic image of scanning electron microscopy (SEM) illustrating the three dimensional type capacitor formed through FIGS. 1A to 1F.

Hereinafter, detailed descriptions on certain embodiments of the present invention will be provided with reference to the accompanying drawings.

FIGS. 3A to 3F are cross-sectional views illustrating a method for fabricating a three dimensional type capacitor in accordance with a first embodiment of the present invention. Herein, among reference numerals illustrated in FIGS. 3A to 3F, the same reference numerals denote the same constitution elements serving the same roles throughout FIGS. 3A to 3F.

Figure 3A:
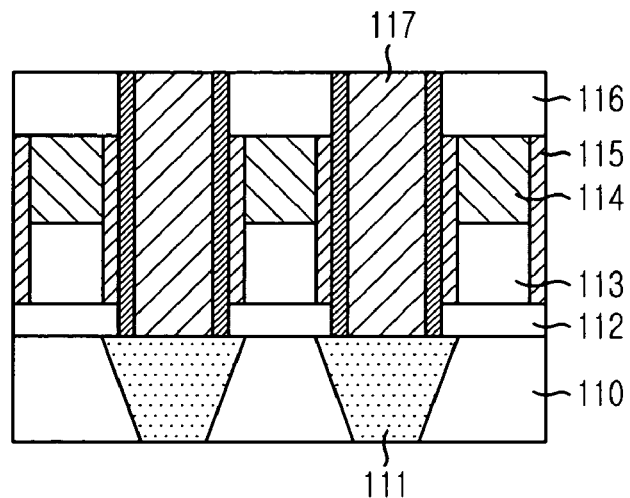
FIGS. 3A to 3F are cross-sectional views illustrating a three dimensional type capacitor in accordance with a first embodiment of the present invention.

First, as shown in FIG. 3A, a first insulation layer 110 in which a plurality of first contact layers 111 are interposed in the first insulation layer 110 is formed over a substrate (not shown) provided with a predetermined lower layer (not shown). Herein, the lower layer may include word lines, metal lines and metal plugs. Furthermore, the first insulation layer 110 is formed by using one selected from the group consisting of a high density plasma (HDP) oxide layer, a borophosphosilicate glass (BPSG) layer, a phosphosilicate glass (PSG) layer, a plasma enhanced tetraethyl orthosilicate (PETEOS) layer, a plasma enhanced chemical vapor deposition (PECVD) layer, a undoped silicate glass (USG) layer, a fluorinated silicate glass (FSG) layer, a carbon doped oxide (CDO) layer, an organic silicate glass (OSG) layer and a combination thereof. Each of the first contact layers 111 can serve a role as a landing plug formed between the word lines.

Next, a second insulation layer 112 is formed over the first insulation layer 110 including the first contact layers 111. Herein, the second insulation layer 112 is deposited by using the identical material used to form the first insulation layer 110.

Next, a plurality of bit lines 113 are formed over the second insulation layer 112. At this time, a plurality of capping layers 114 are formed over the bit lines 113 to protect the bit lines 113, and a plurality of spacers 115 can be formed on sidewalls of the bit lines 113.

Next, a third insulation layer 116 is deposited over the above resulting structure including the bit lines 113. Afterwards, the third insulation layer 116 and the second insulation layer 112 are etched, thereby forming a plurality of first contact holes (not shown) exposing the first contact layers 111.

Next, a material having an etch selectivity different from the first contact layers 111 is deposited to fill the first contact holes and then, a chemical mechanical polishing (CMP) process is performed. Through these steps, a plurality of second contact layers 117 burying the first contact holes are formed. Herein, the second contact layers 117 are formed by using a material having an etch selectivity different from the first contact layers 111. Thus, during a wet etching process supposed to be performed subsequently, the second contact layers 117 are removed; however, the first contact layers 111 are not etched but remain.

Figure 3B:
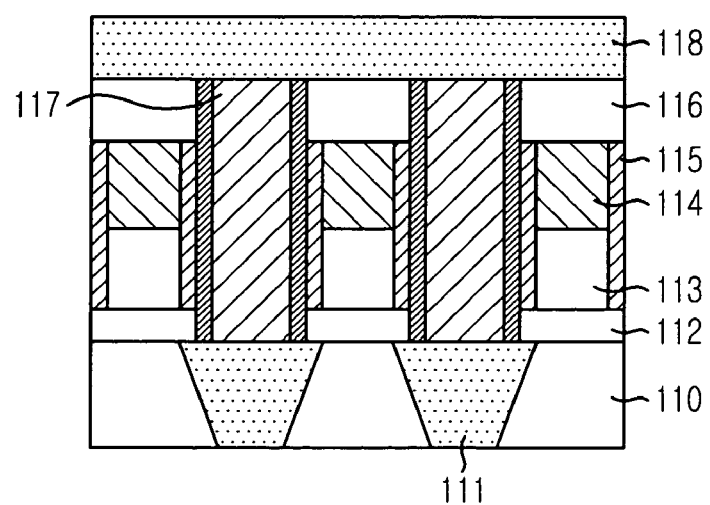

Next, as shown in FIG. 3B, an etch stop layer 118 is deposited over the third insulation layer 116 including the second contact layers 117. At this time, the etch stop layer 118 is made of silicon nitride (SiN).

Figure 3C:
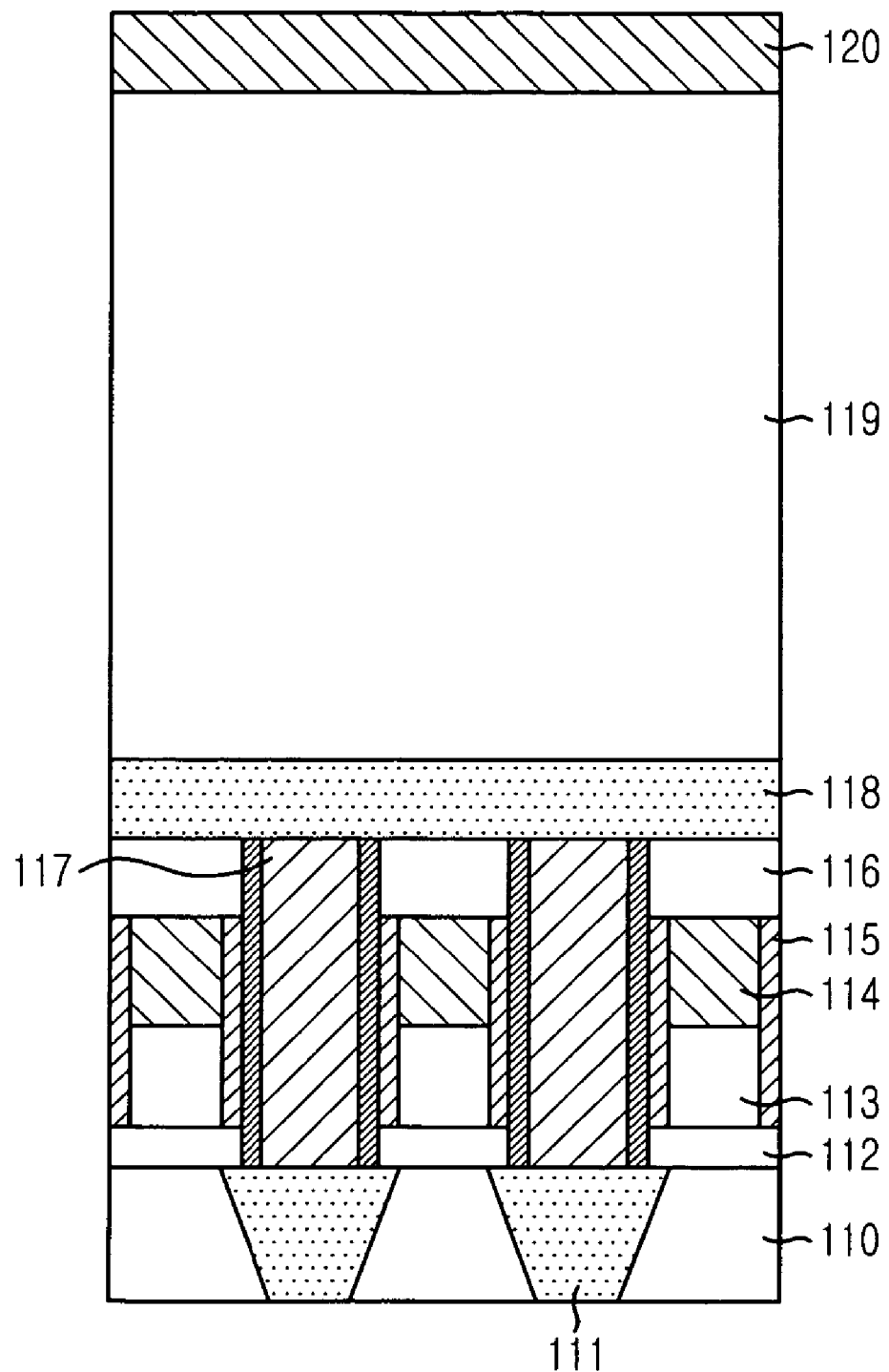

Next, as shown in FIG. 3C, a fourth insulation layer 119 is deposited over the etch stop layer 118. At this time, the fourth insulation layer 119 is formed in a single layer or a stacked layer by using the identical material used to form the first insulation layer 110.

Next, a hard mask 120 is formed over the fourth insulation layer 119. At this time, the hard mask 120 is formed by using a material having a physical property identical to the second contact layers 117.

Figure 3D:
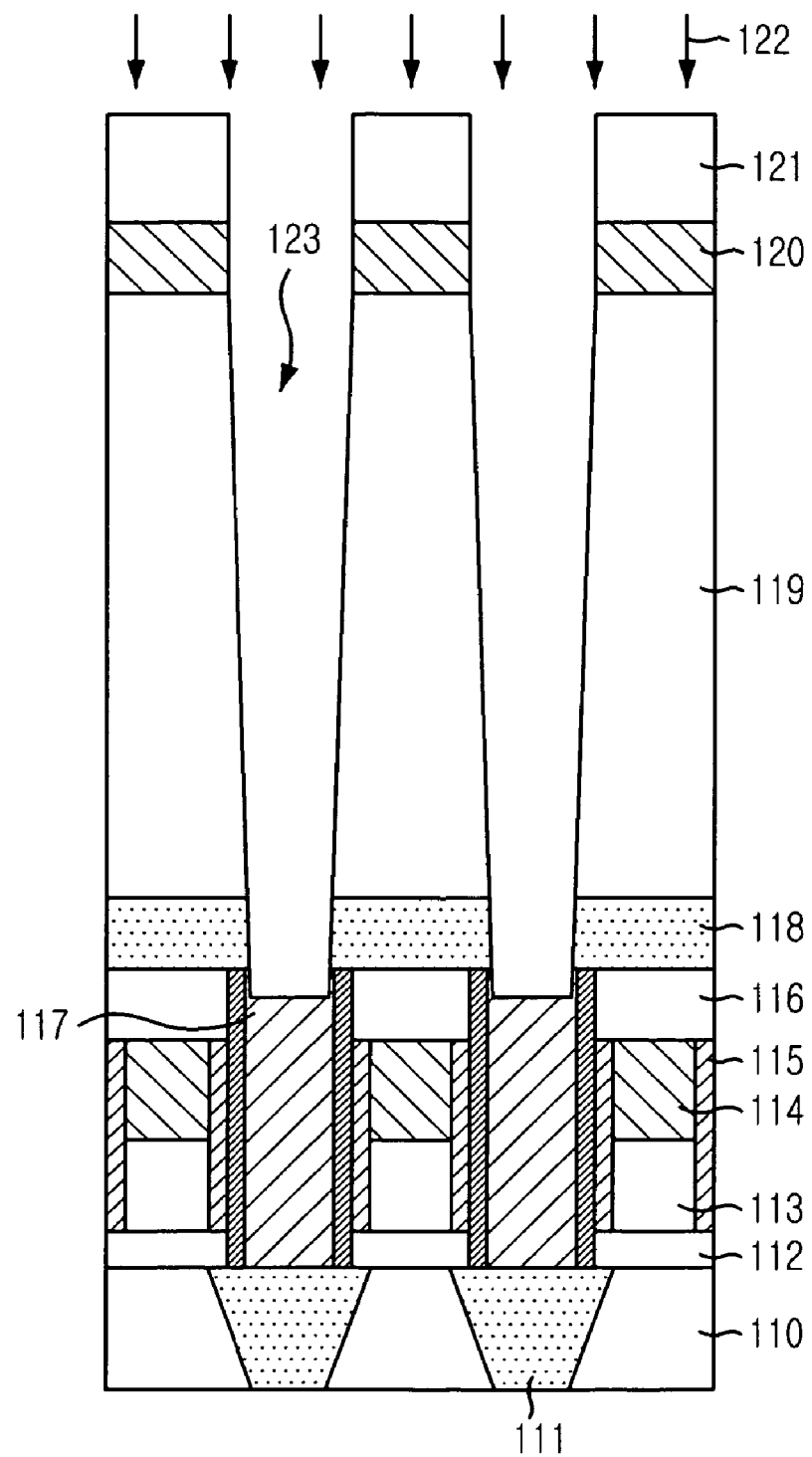

Next, as shown in FIG. 3D, a photoresist layer (not shown) is deposited over the hard mask 120 and then, a photoresist pattern 121 is formed through a photo exposure process and a developing process using a photomask (not shown)

Next, an etching process 122 is performed by using the photoresist pattern 121 as an etch mask, thereby etching the hard mask 120 and the fourth insulation layer 119. At this time, the etching process is stopped once over a certain portion of the etch stop layer 118 and thus, a plurality of second contact holes 123 exposing the certain portions of the etch stop layer 118 can be formed through the etching process 122.

Next, a stripping process is performed, thereby removing a photoresist pattern 121, an etching process using a plasma method is performed, thereby removing the hard mask 120.

Next, by performing the etching process using the plasma method, the etch stop layer 118 exposed beneath bottom portions of the second contact holes 123 is etched.

Figure 3E:
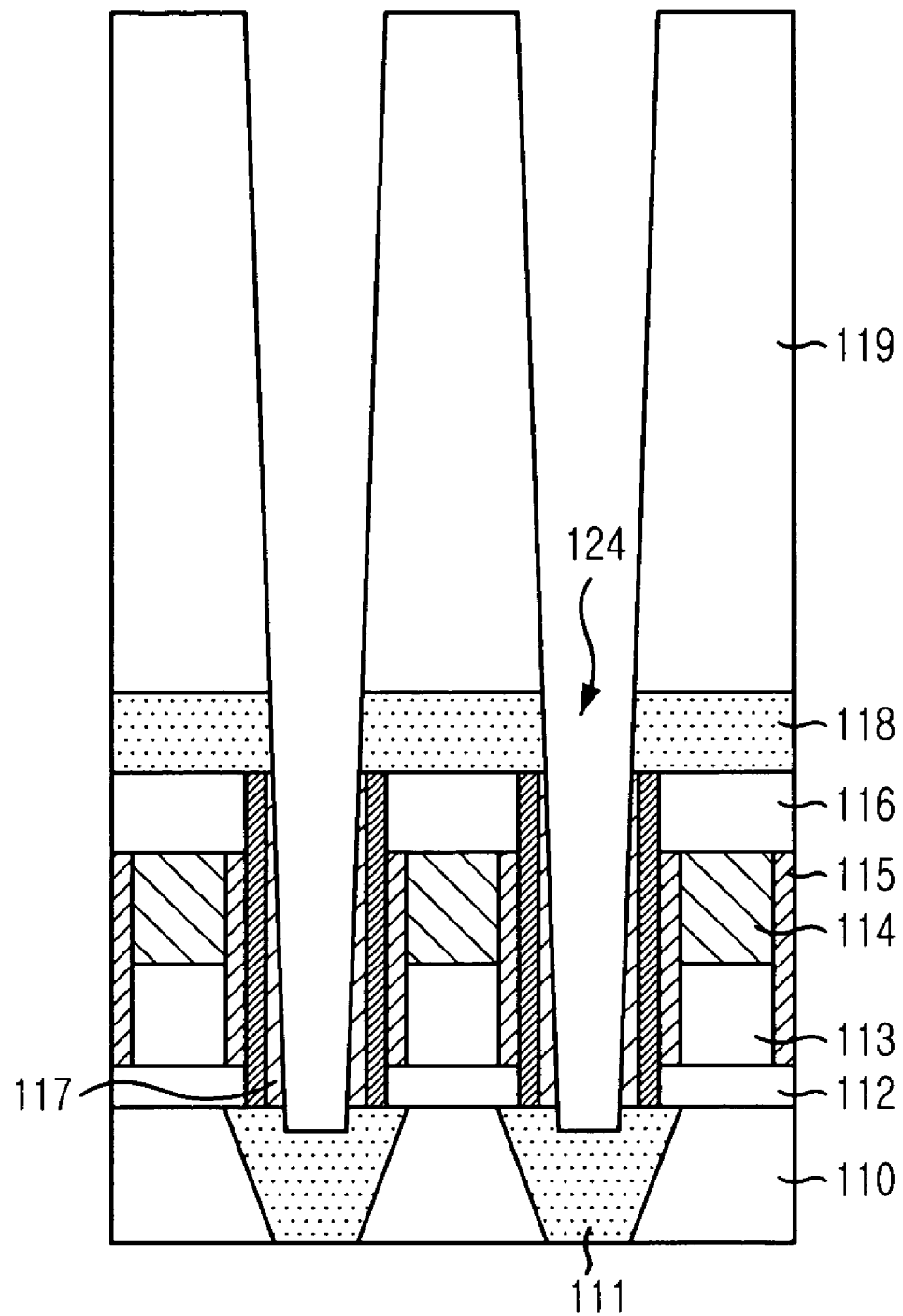

Next, as shown in FIG. 3E, a wet etching process is performed, thereby etching the second contact layers 117 exposed due to the removal of the etch stop layer 118. Thus, a plurality of third contact holes 124 exposing the first contact layers 111 are formed.

Figure 3F:
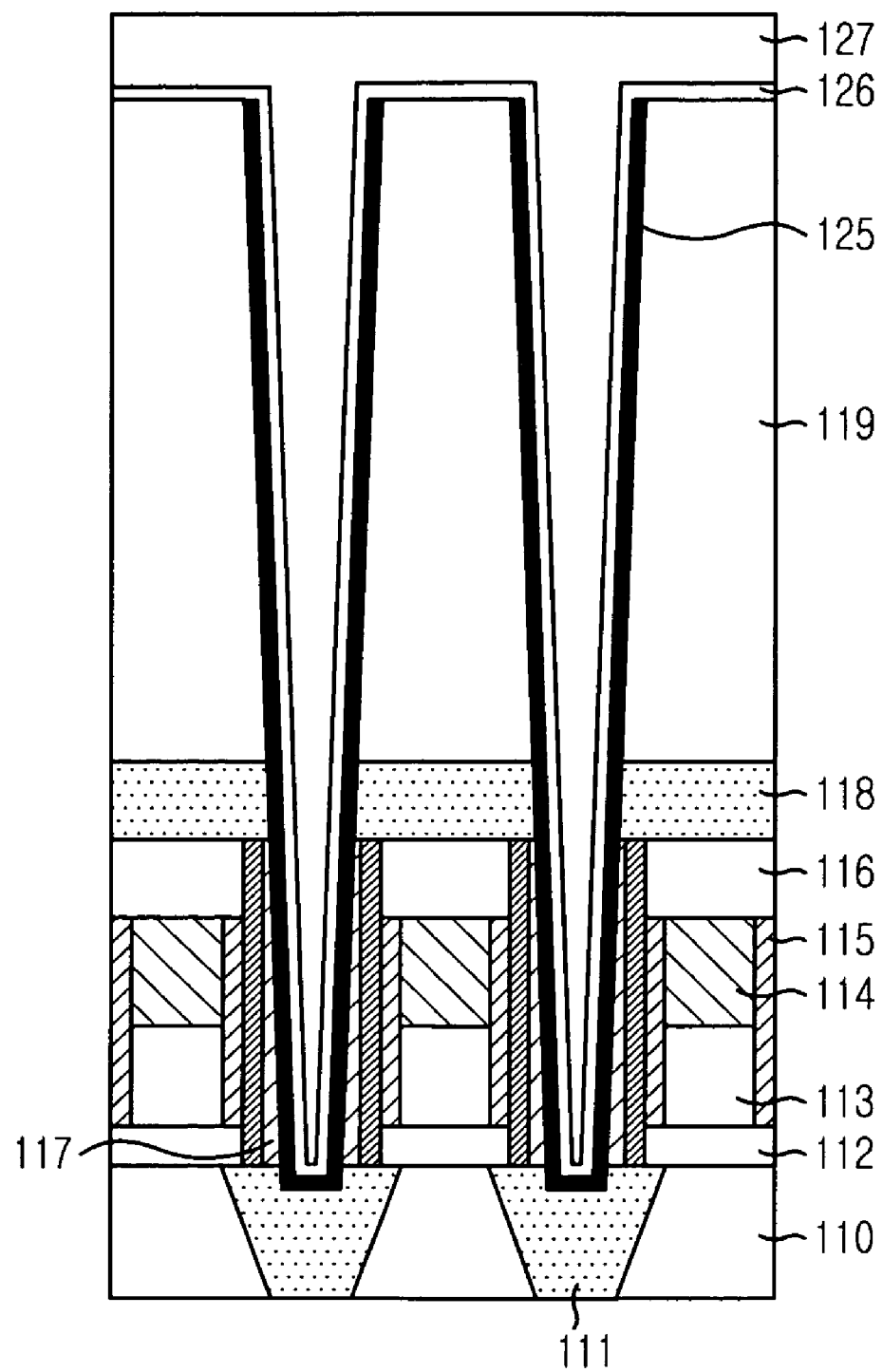

Next, as shown in FIG. 3F, a bottom electrode 125 of a capacitor is formed over an inner surface of each of the third contact holes 124 (refer to FIG. 3E), and a dielectric layer 126 of a capacitor is formed over a height difference of the above resulting structure including the bottom electrodes 125. Thereafter, a top electrode 127 of a capacitor is formed over the dielectric layer 126 to bury the third contact holes 124.

That is, in accordance with the first embodiment of the present invention, during the formation of the three dimensional type semiconductor device, the first contact layers and the second contact layers formed over the first contact layers are made of a different material having different etch selectivity from each other. Thus, during the wet etching process, the second contact layers are removed; however, the first contact layers remain. Also, the bottom electrode of the capacitor is formed over the inner surface of the first to fourth insulation layers formed over the first contact layers.

Accordingly, since a depth of the bottom electrode is increased as much as a depth of each of the second contact layers compared to the conventional method, it is possible to increase an effective surface area of the capacitor. Accordingly, it is possible to secure a high capacitance of the capacitor.

Figure 4:
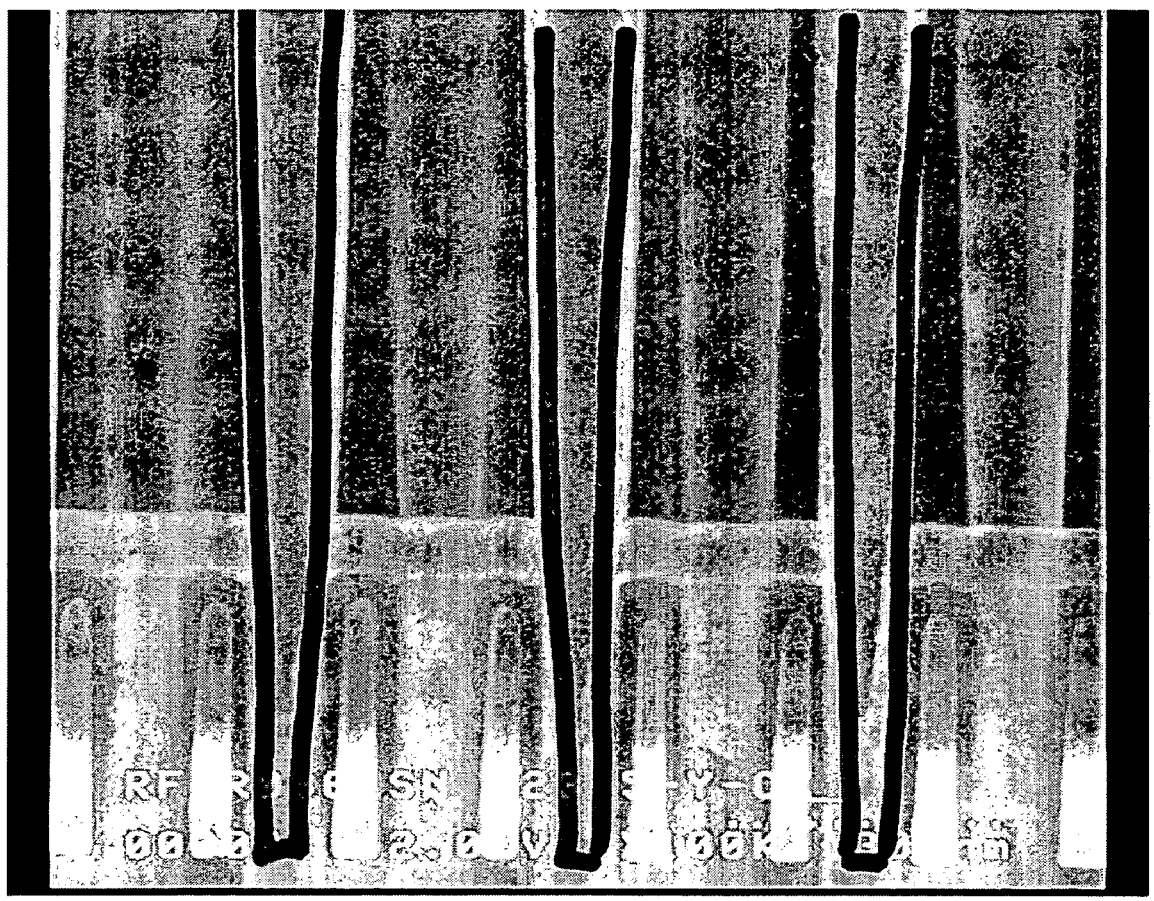
FIG. 4 is a micrographic image of SEM illustrating the three dimensional type capacitor in accordance with the first embodiment of the present invention.

FIG. 4 is a microscopic image of scanning electron microscopy (SEM) illustrating the three dimensional type capacitor in accordance with the first embodiment of the present invention.

FIGS. 5A to 5F are cross-sectional views illustrating a method for fabricating a three dimensional type capacitor in accordance with a second embodiment of the present invention. Herein, among reference numerals illustrated in FIGS. 5A to 5F, the same reference numerals denote the same constitution elements serving the same roles throughout FIGS. 5A to 5F. Furthermore, the second embodiment of the present invention is different from the first embodiment of the present invention only in which an insulation layer is not interposed between a plurality of bit lines and an etch stop layer. Accordingly, details illustrated in FIGS. 5A to 5F are briefly explained hereinafter.

Figure 5A:
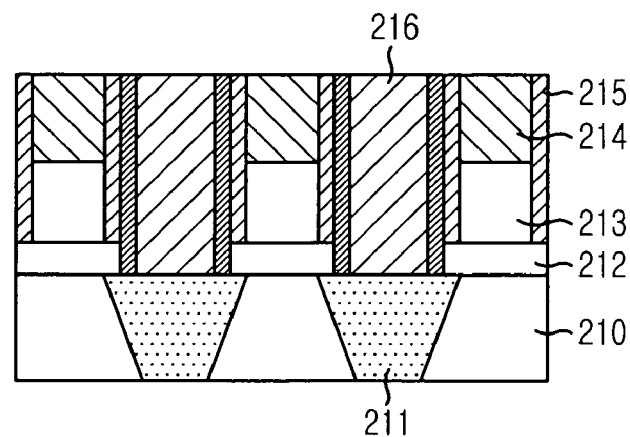
FIGS. 5A to 5F are cross-sectional views illustrating a three dimensional type capacitor in accordance with a second embodiment of the present invention.

First, as shown in FIG. 5A, a first insulation layer 210 in which a plurality of first contact layers 211 are interposed in the first insulation layer 210 is formed over a semiconductor substrate (not shown) provided with a predetermined lower layer (not shown). Herein, the lower layer may include word lines, metal lines, and metal plugs.

Next, a second insulation layer 212 is deposited over the first insulation layer 210 including the first contact layers 211, and a plurality of bit lines 213 are formed over the second insulation layer 212. At this time, a plurality of capping layers 214 are formed over the bit lines 213 to protect the bit lines 213, and a plurality of spacers 215 may be formed on sidewalls of the bit lines 213.

Next, a material having an etch selectivity different from the first contact layers 211 is formed over the second insulation layer 212 including the bit lines 213 and afterwards, a chemical mechanical polishing (CMP) process is performed, thereby planarizing the aforementioned material. Accordingly, a plurality of second contact layers 216 connected to the first contact layers 211 are formed between the bit lines 213. Herein, since the second contact layers 216 are formed by using the material having an etch selectivity different from the first contact layers 211, during a wet etching process supposed to be performed subsequently, the second contact layers 216 are removed; however, the first contact layers 211 are not etched, but remain.

Figure 5B:
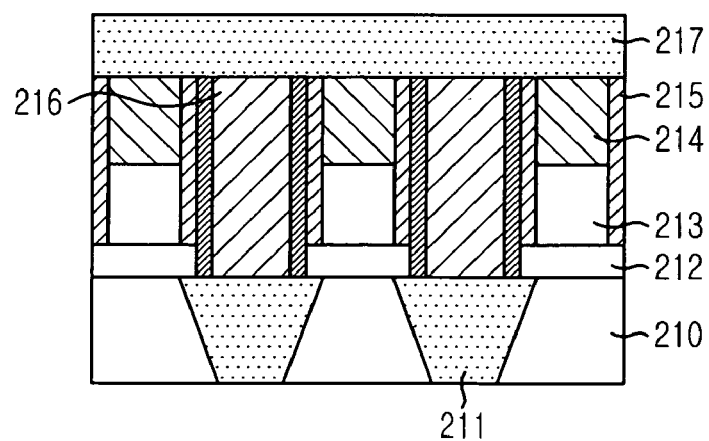

Next, as shown in FIG. 5B, an etch stop layer 217 is deposited over the above resulting structure including the second contact layers 216.

Figure 5C:
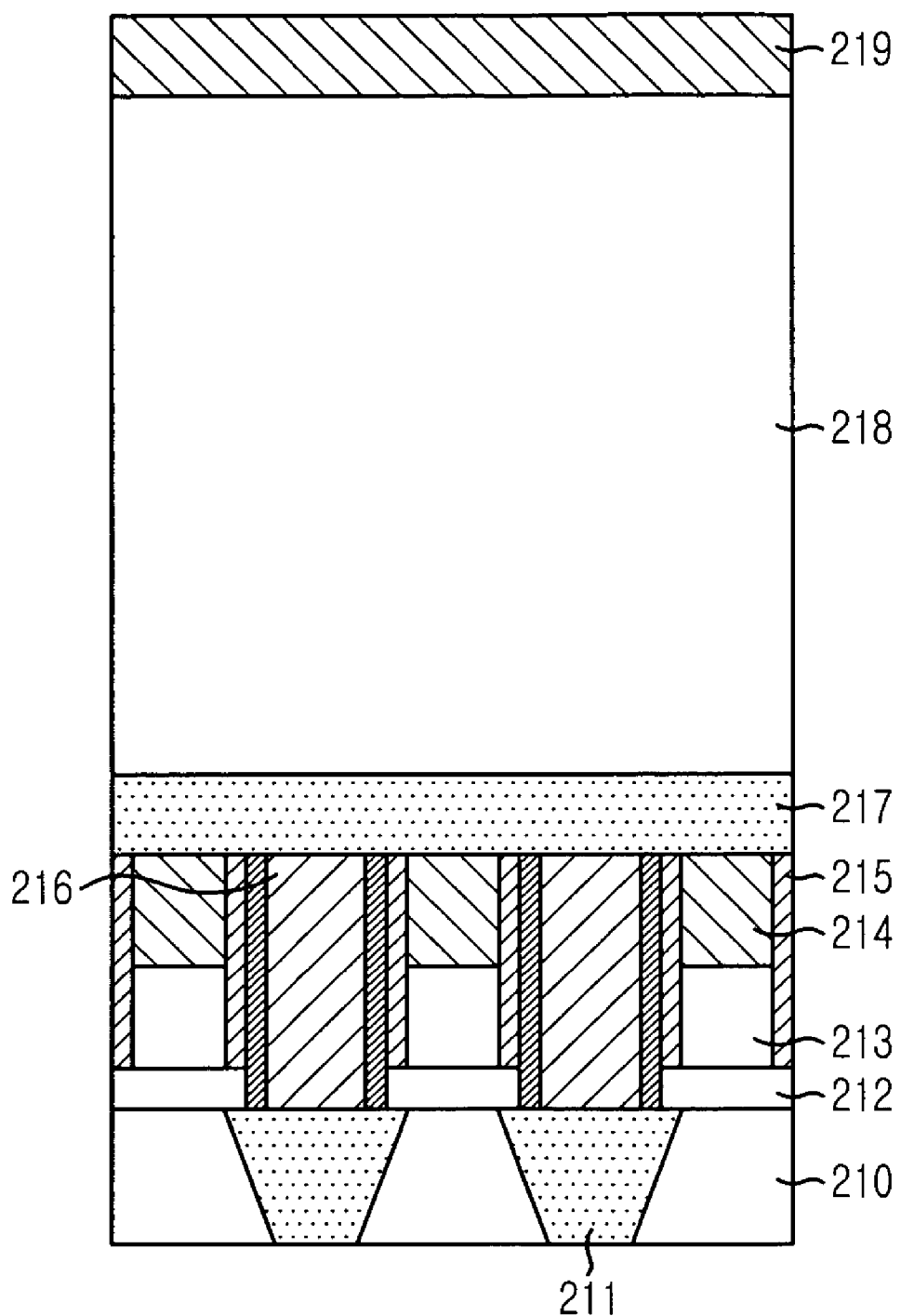

Next, as shown in FIG. 5C, a third insulation layer 218 and a hard mask 219 are deposited over the etch stop layer 217.

Figure 5D:
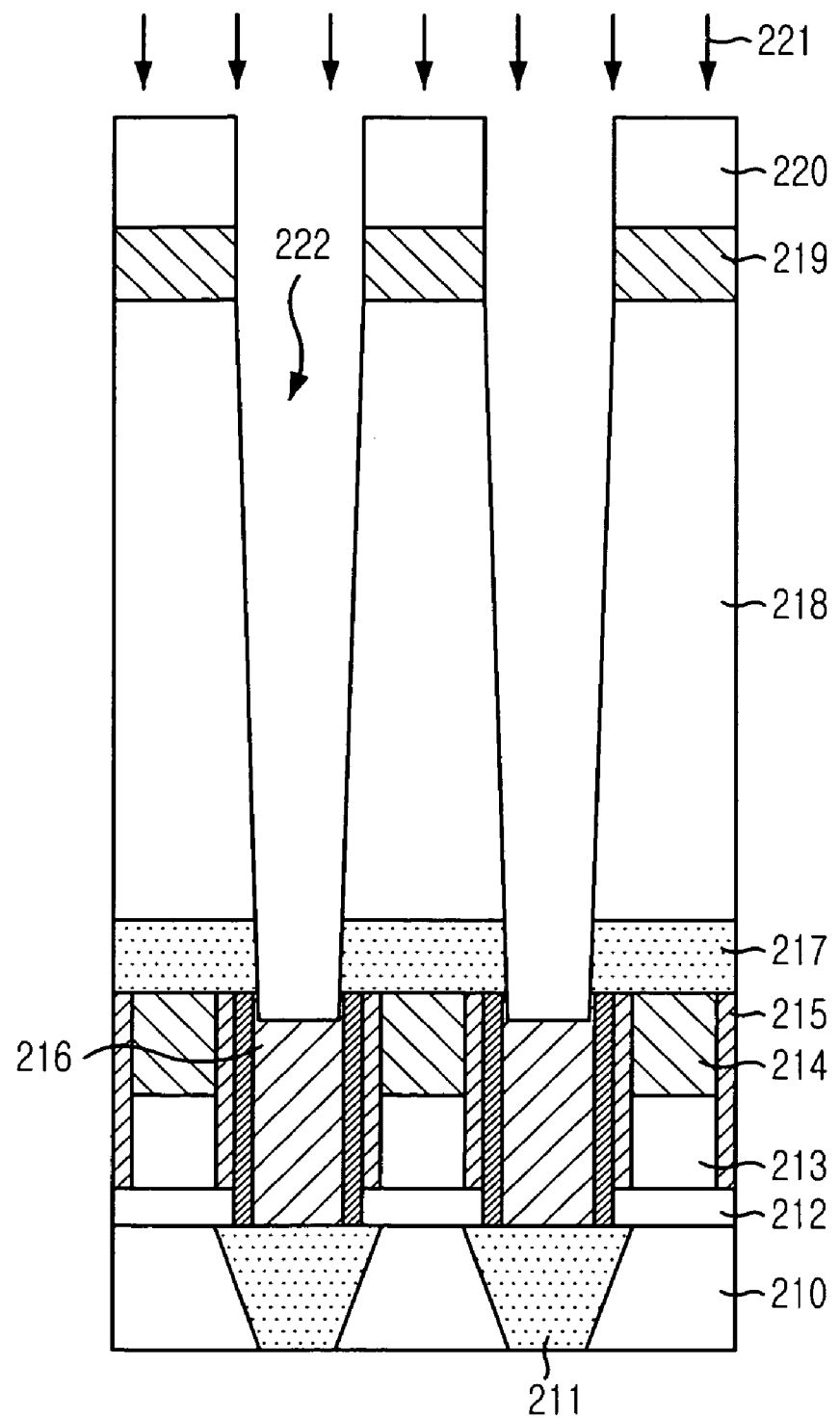

Next, as shown in FIG. 5D, a photoresist layer (not shown) is deposited over the hard mask 219 and then, through a photo-exposure process and a developing process, a photoresist pattern 220 is formed.

Next, an etching process 221 using the photoresist pattern 220 as an etch mask is performed, thereby etching the hard mask 219 and the third insulation layer 218. At this time, since the etching process 221 is stopped once over a certain portion of the etch stop layer 217, a plurality of first contact holes 222 exposing the certain portions of the etch stop layer 217 can be formed through the etching process 221.

Next, a striping process is performed, thereby removing the photoresist pattern 220 and an etching process using a plasma method is performed, thereby removing the hard mask 219.

Next, the etching process using the plasma method is performed, thereby etching the etch stop layer 217 exposed beneath bottom portions of the first contact holes 222.

Figure 5E:
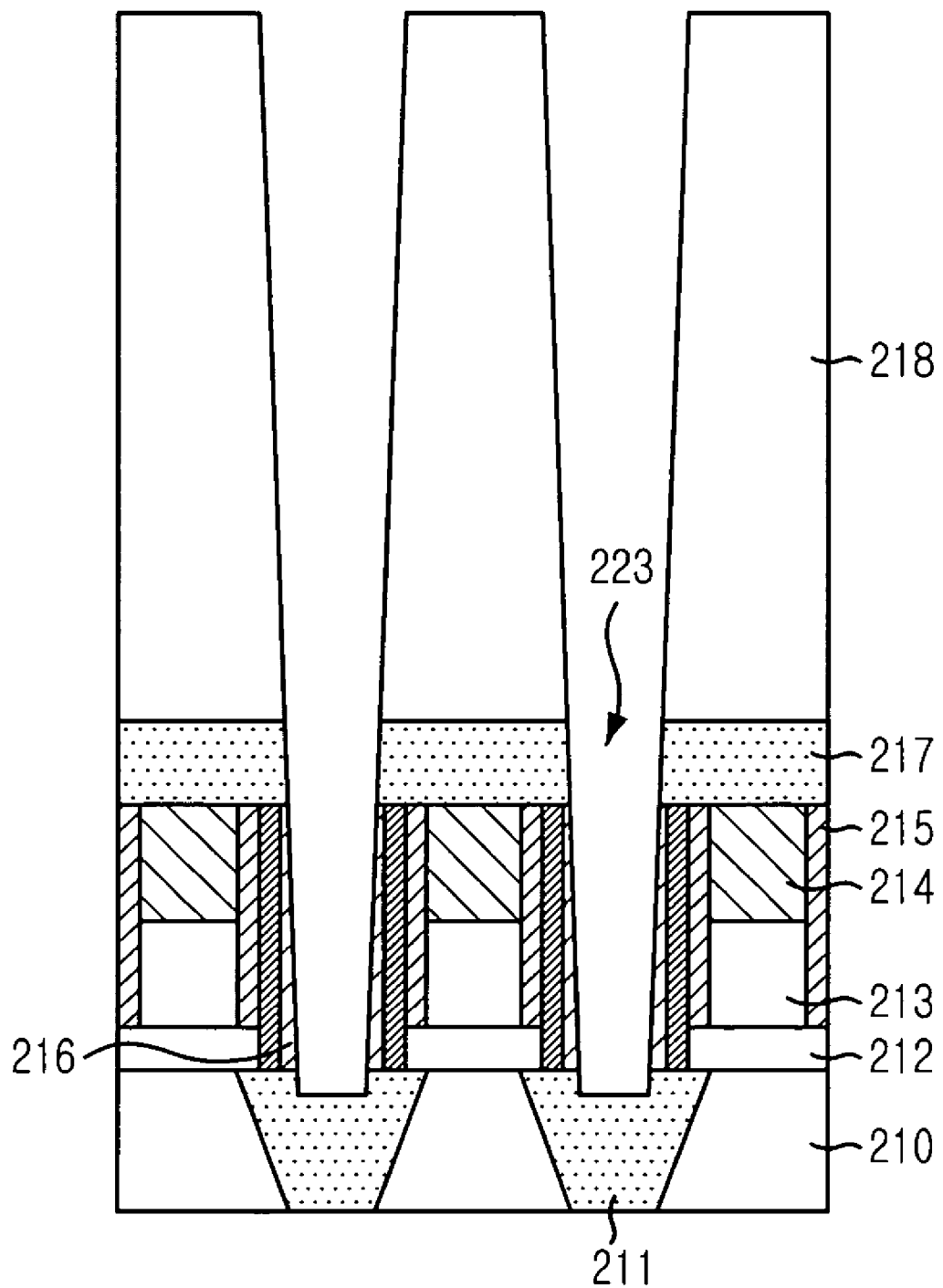

Next, as shown in FIG. 5E, a wet etching process is performed and thus, the second contact layers 216 exposed due to the removal of the etch stop layer 217 are etched. Through these steps, a plurality of second contact holes 223 exposing the first contact layers 211 are formed.

Figure 5F:
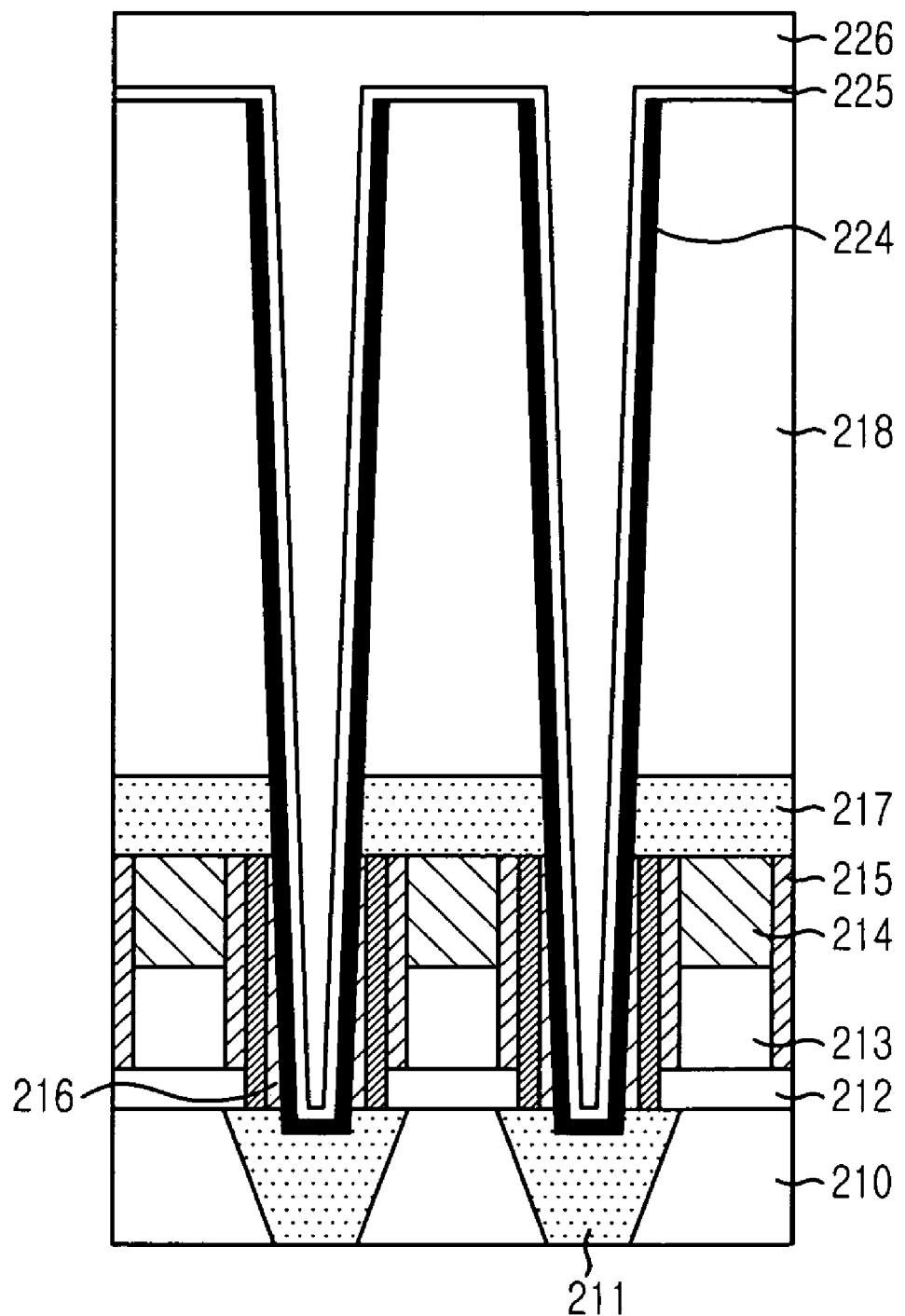

Next, as shown in FIG. 5F, a bottom electrode 224 of a capacitor is formed over an inner surface of each of the second contact hole 223 (refer to FIG. 5E), and a dielectric layer 225 of the capacitor is formed over a height difference of the above resulting structure including the bottom electrode 224. Thereafter, a top electrode 226 of the capacitor is formed over the dielectric layer 225 to bury the second contact holes 223.

As described above, in accordance with the present invention, during the formation of the three-dimensional type capacitor of the semiconductor device, since the first contact layers and the second contact layers formed over the first contact layers are made of a material having an etch selectivity different from each other, the second contact layers are removed; however, the first contacts layer remain. The bottom electrode of the capacitor is formed over the inner surface of the insulation layers over the first contact layers. Accordingly, since a depth of the bottom electrode is increased as much as a depth of the second contact layer, it is possible to increase an effective surface area of the capacitor. Due to the increased effective surface area, it is possible to secure a high capacitance of the capacitor.

The present application contains subject matter related to the Korean patent application No. KR 2005-51344, filed in the Korean Patent Office on Jun. 15, 2005, the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. A method for fabricating a semiconductor device, comprising:
    forming a first insulation layer including a plurality of first contact layers over a substrate;
    forming a second insulation layer over the first insulation layer;
    forming a plurality of second contact layers by using a material having an etch selectivity different from the first contact layers such that the second contact layers are connected with the first contact layers within the second insulation layer;
    forming an etch stop layer over the second insulation layer and the second contact layers;
    forming a third insulation layer over the etch stop layer;
    forming a hard mask over the third insulation layer, wherein the hard mask includes a material having a physical property substantially identical to that of the second contact layers;
    etching the third insulation layer and the etch stop layer using the hard mask as an etch mask to form a plurality of first contact holes exposing the second contact layers;
    etching the exposed second contact layers to form a plurality of second contact holes exposing the first contact holes; and
    forming bottom electrodes over the inner surface of the second contact holes.

2. The method of claim 1, wherein a plurality of bit lines are interposed in the second insulation layer.

3. The method of claim 2, wherein the second insulation layer is formed to cover the bit lines.

4. The method of claim 1, wherein the first contact layers serve a role as a landing plug.

5. The method of claim 2, wherein the first contact layers serve a role as a landing plug.

6. A method for fabricating a semiconductor device, comprising:

forming a first stack structure over a substrate including a plurality of first contact layers;

forming a plurality of first openings inside the first stack structure such that the first openings expose the first contact layers;

forming a plurality of second contact layers in the first openings;

forming a second stack structure and a hard mask over the second contact layers and the first stacked structure, wherein the hard mask includes a material includes a material having a physical property substantially identical to that of the second contact layers;

etching the second stack structure using the hard mask as an etch mask to expose the second contact layers;

etching the exposed second contact layers to form second openings exposing the first contact layers; and forming bottom electrodes over the inner surface of the second openings.

7. The method of claim 6, wherein the first stack structure includes a plurality of insulation layers.

8. The method of claim 7, wherein a plurality of bit lines are interposed in the insulation layers.

9. The method of claim 6, further comprising planarizing the second contact layers after forming the second contact layers in the first openings.

10. The method of claim 9, further including forming an etch stop layer after the planarizing of the second contact layers.

11. The method of claim 6, wherein the first stack structure includes a first insulation layer, bit line structures formed over the first insulation layer, and a second insulation layer over the bit line structures, and the individual bit line structure includes a bit line, a capping layer over the bit line, and a spacer surrounding the capping layer.

12. The method of claim 6, wherein the second stack structure includes an etch stop layer and an insulation layer.

13. The method of claim 6, wherein the second contact layers includes a material having an etch selectivity different from the first contact layers.

* * * * *